(12) United States Patent
Yonetsu et al.

(10) Patent No.: US 11,948,900 B2
(45) Date of Patent: Apr. 2, 2024

(54) BONDED BODY, CIRCUIT BOARD, AND SEMICONDUCTOR DEVICE

(71) Applicants: KABUSHIKI KAISHA TOSHIBA, Tokyo (JP); TOSHIBA MATERIALS CO., LTD., Yokohama (JP)

(72) Inventors: Maki Yonetsu, Mitaka (JP); Seiichi Suenaga, Yokohama (JP); Sachiko Fujisawa, Kawasaki (JP); Takayuki Naba, Chigasaki (JP)

(73) Assignees: KABUSHIKI KAISHA TOSHIBA, Tokyo (JP); TOSHIBA MATERIALS CO., LTD., Yokohama (JP)

( * ) Notice: Subject to any disclaimer, the term of this patent is extended or adjusted under 35 U.S.C. 154(b) by 399 days.

(21) Appl. No.: 17/446,765

(22) Filed: Sep. 2, 2021

(65) Prior Publication Data

US 2021/0398928 A1    Dec. 23, 2021

Related U.S. Application Data

(63) Continuation of application No. PCT/JP2020/031407, filed on Aug. 20, 2020.

(30) Foreign Application Priority Data

Sep. 2, 2019    (JP) .................................. 2019-159468

(51) Int. Cl.
*B23K 1/19*    (2006.01)
*C04B 37/02*    (2006.01)
(Continued)

(52) U.S. Cl.
CPC ................ *H01L 24/05* (2013.01); *B23K 1/19* (2013.01); *C04B 37/02* (2013.01); *H01L 23/13* (2013.01);
(Continued)

(58) Field of Classification Search
CPC ........... H01L 24/05; H01L 2224/05166; H01L 2224/29166; H01L 24/08; B23K 1/19
See application file for complete search history.

(56) References Cited

U.S. PATENT DOCUMENTS 5,807,626 A    9/1998 Naba
10,818,585 B2 * 10/2020 Terasaki ............... H01L 21/4857
(Continued)

FOREIGN PATENT DOCUMENTS

CN    101148365 A    3/2008
CN    101468799 A    7/2009
(Continued)

OTHER PUBLICATIONS

International Search Report dated Oct. 27, 2020 in PCT/JP2020/031407 filed on Aug. 20, 2020, 3 pages.
(Continued)

*Primary Examiner* — Mamadou L Diallo
(74) *Attorney, Agent, or Firm* — Oblon, McClelland, Maier & Neustadt, L.L.P.

(57) ABSTRACT

A bonded body according to an embodiment includes a substrate, a metal member, and a bonding layer. The bonding layer is provided between the substrate and the metal member. The bonding layer includes a first particle including carbon, a first region including a metal, and a second region including titanium. The second region is provided between the first particle and the first region. A concentration of titanium in the second region is greater than a concentration of titanium in the first region.

21 Claims, 8 Drawing Sheets

(51) Int. Cl.
  *H01L 23/00* (2006.01)
  *H01L 23/13* (2006.01)
(52) U.S. Cl.
  CPC .... *H01L 24/08* (2013.01); *H01L 2224/05139* (2013.01); *H01L 2224/05147* (2013.01); *H01L 2224/05166* (2013.01); *H01L 2224/05187* (2013.01); *H01L 2224/08245* (2013.01)

(56) References Cited

U.S. PATENT DOCUMENTS

| | | | |
|---|---|---|---|
| 2012/0074572 A1* | 3/2012 | Fischer | H01L 24/05 438/653 |
| 2012/0080216 A1 | 4/2012 | Abe et al. | |
| 2012/0168209 A1 | 7/2012 | Kato | |
| 2014/0017469 A1* | 1/2014 | Fukunaga | C23C 28/048 428/323 |
| 2016/0221305 A1 | 8/2016 | Terasaki et al. | |
| 2016/0358840 A1 | 12/2016 | Aono et al. | |
| 2017/0181279 A1* | 6/2017 | Koike | H05K 1/11 |
| 2018/0154612 A1* | 6/2018 | Kitaura | B32B 9/041 |
| 2020/0044031 A1* | 2/2020 | Pham | H01L 24/05 |

FOREIGN PATENT DOCUMENTS

| | | | | |
|---|---|---|---|---|
| EP | 3 031 789 A1 | 6/2016 | | |
| EP | 3 109 222 A1 | 12/2016 | | |
| EP | 3 492 441 A1 | 6/2019 | | |
| JP | 05-148053 A | 6/1993 | | |
| JP | 05-319946 A | 12/1993 | | |
| JP | 09-283656 A | 10/1997 | | |
| JP | 10-158073 A | 6/1998 | | |
| JP | WO2010/137651 A1 | 12/2010 | | |
| JP | WO2011/034075 A1 | 3/2011 | | |
| JP | 2012-115846 A | 6/2012 | | |
| JP | 2014-118310 A | 6/2014 | | |
| JP | WO2015/019602 A1 | 2/2015 | | |
| JP | 2015-092552 A | 5/2015 | | |
| JP | WO2015/125907 A1 | 8/2015 | | |
| JP | WO2018/021472 A1 | 2/2018 | | |
| JP | 6307386 B2 | 4/2018 | | |
| JP | WO2018021472 A1 * | 5/2019 | | H05K 3/38 |
| WO | WO-2012058656 A2 * | 5/2012 | | H01L 23/373 |
| WO | WO-2015072250 A1 * | 5/2015 | | B22F 3/12 |

OTHER PUBLICATIONS

Zhu et al., "Improving the strength of brazed joints to alumina by adding carbon fibres", Journal of Materials Science, vol. 32, No. 20, Oct. 1, 1997, pp. 5321-5333, XP002736609.

Lin et al., "Joints of carbon fiber-reinforced SiC composites to Ti-alloy brazed by Ag—Cu—Ti short carbon fibers", Journal of Materials Processing Technology, vol. 189, No. 1-3, Apr. 7, 2007, pp. 256-261, XP022024262.

* cited by examiner

BONDED BODY, CIRCUIT BOARD, AND SEMICONDUCTOR DEVICE

CROSS-REFERENCE TO RELATED APPLICATIONS

This is a continuation application of International Patent Application PCT/JP2020/031407, filed on Aug. 20, 2020. This application also claims priority to Japanese Patent Application No. 2019-159468, filed on Sep. 2, 2019; the entire contents of which are incorporated herein by reference.

FIELD

Embodiments of the invention relate to a bonded body, a circuit board, and a semiconductor device.

BACKGROUND

There is a bonded body in which a substrate and a metal member are bonded via a bonding layer. High bonding strength of the bonded body is desirable.

DETAILED DESCRIPTION

Figure 1:
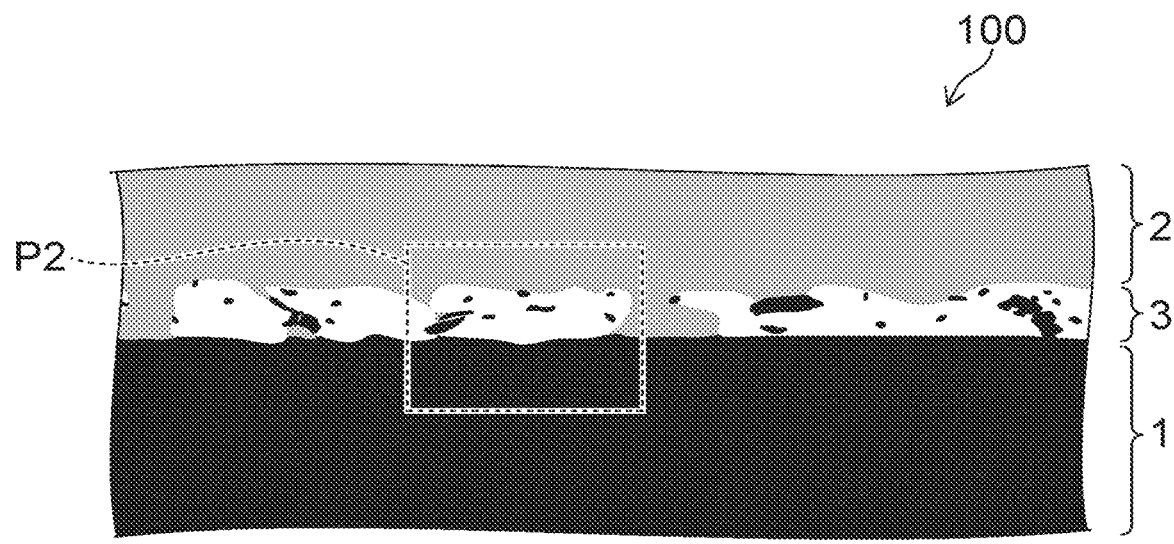
FIG. 1 is a schematic cross-sectional view showing a bonded body according to an embodiment.

A bonded body according to an embodiment includes a substrate, a metal member, and a bonding layer. The bonding layer is provided between the substrate and the metal member. The bonding layer includes a first particle including carbon, a first region including a metal, and a second region including titanium. The second region is provided between the first particle and the first region. A concentration of titanium in the second region is greater than a concentration of titanium in the first region.

Various Embodiments will now be described with reference to the drawings.

The drawings are schematic or conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those already described are marked with the same reference numerals, and a detailed description is omitted as appropriate.

FIG. 1 is a schematic cross-sectional view showing a bonded body according to an embodiment.

As shown in FIG. 1, the bonded body 100 according to the embodiment includes a substrate 1, a metal member 2, and a bonding layer 3. The bonding layer 3 is located between the substrate 1 and the metal member 2.

The substrate 1 includes at least one selected from the group consisting of silicon (Si) and aluminum (Al) and at least one selected from the group consisting of nitrogen (N), oxygen (O), and carbon (C). The substrate 1 may further include zirconium (Zr) and oxygen. The substrate 1 is, for example, a ceramic substrate. A silicon nitride substrate, an aluminum nitride substrate, an alumina substrate, a zirconia-including alumina substrate (an Alusil substrate), or a silicon carbide substrate can be used as the ceramic substrate.

It is favorable for the three-point bending strength of the substrate 1 to be not less than 500 MPa. When the three-point bending strength of the substrate 1 is not less than 500 MPa, the thickness of the substrate 1 can be reduced to be not more than 0.4 mm. A silicon nitride substrate, a high-strength aluminum nitride substrate, an alumina substrate, a zirconia-including alumina substrate, a silicon carbide substrate, etc., are examples of ceramic substrates having a three-point bending strength that is not less than 500 MPa.

Among these ceramic substrates, the silicon nitride substrate is favorable. By using the silicon nitride substrate, a three-point bending strength that is not less than 500 MPa, and even not less than 600 MPa can be realized. When the three-point bending strength of the substrate 1 is high, the thermal cycle test characteristics (the TCT characteristics) can be improved even when the thickness of the substrate 1 is reduced. Also, by using the silicon nitride substrate, a thermal conductivity that is not less than 50 W/m·K, and even not less than 80 W/m·K can be realized. In recent years, there are also silicon nitride substrates in which both high strength and high thermal conductivity can be realized. The thickness of the substrate 1 also can be reduced to be not more than 0.30 mm by using a silicon nitride substrate having a three-point bending strength that is not less than 500 MPa and a thermal conductivity that is not less than 80 W/m·K. The three-point bending strength is measured according to JIS-R-1601. JIS-R-1601 corresponds to ISO 14704 (2000). The thermal conductivity is measured according to ES-R-1611. The JIS-R-1611 corresponds to ISO 18755 (2005).

The metal member 2 includes at least one selected from the group consisting of copper (Cu) and aluminum. The metal member 2 is, for example, a copper plate, a copper alloy plate, an aluminum plate, an aluminum alloy plate, etc. An element other than copper and aluminum may be included in these members. For example, the metal member 2 may further include at least one selected from the group consisting of tungsten (W), nickel (Ni), molybdenum (Mo), and chromium (Cr). As a specific example, the metal member 2 includes Cu—W—Ni, Cu—Mo, Cu—Cr, Cu—W, or Al—Si. The metal member 2 may include a cladding material made of at least two selected from Cu—W—Ni, Cu—Mo, Cu—Cr, Cu—W, and Al—Si. The metal member 2 may be patterned into an interconnect pattern. It is favorable for the thickness of the metal member 2 to be not less than 0.3 mm, and more favorably not less than 0.7 mm. By making the metal member 2 thick, the heat dissipation can be improved. The current-carrying capacity can be increased when the metal member 2 is used as a circuit.

The thermal resistance (Rth) is determined by the formula: Rth=H/(k×A). H is the heat transfer path. k is the thermal conductivity. A is the heat dissipation area. By making the heat transfer path (H) short, the thermal conductivity (k) can be increased; or, by increasing the heat dissipation area (A), the thermal resistance (Rth) can be reduced. In the bonded body 100 according to the embodiment, the heat transfer path of the portion where the thermal conductivity is low can be made short by thinning the substrate 1. Also, by making the metal member 2 thick, the thermal conductivity (k) and the heat dissipation area (A) of the bonded body 100 can be increased. As a result, the thermal resistance (Rth) can be reduced.

The bonding layer 3 can include a low melting-point metal. The melting point of the metal is less than the melting point of the substrate 1 and not more than the melting point of the metal member 2. The metal includes, for example, at least one selected from the group consisting of silver (Ag), copper, tin (Sn), and indium (In). In the bonded body 100, the bonding layer 3 further includes an active metal and carbon. The flowability and the wetting of the brazing material when bonding can be suppressed by adding carbon. Mainly, titanium (Ti) is used as the active metal. Titanium and at least one selected from the group consisting of zirconium and hafnium (Hf) may be used as the active metal.

For example, the bonding layer 3 includes copper, titanium, and carbon. The bonding layer 3 may further include silver. It is favorable for the content ratio of silver in the bonding layer 3 to be not less than 0 mass % and not more than 80 mass %. It is favorable for the content ratio of copper to be not less than 15 mass % and not more than 88 mass %. To increase the bonding strength, it is favorable for the content ratio of silver to be not less than 45 mass % and not more than 80 mass %, and for the content ratio of copper to be not less than 15 mass % and not more than 45 mass %. It is favorable for the content ratio of titanium to be not less than 1 mass % and not more than 12 mass %. It is favorable for the content ratio of carbon to be not less than 0.1 mass % and not more than 2 mass %. When the content ratio of carbon is less than 0.1 mass %, there is a possibility that the effect of suppressing the flowability and/or the wetting of the brazing material may be insufficient. When the content ratio of carbon is greater than 2 mass %, there is a possibility that the flowability of the brazing material may become too low, and a uniform coating on the substrate 1 may become difficult. When the bonding layer 3 includes at least one selected from tin (Sn) and indium (In), it is favorable for the content ratio of the at least one selected from tin (Sn) and indium (In) to be not less than 5 mass % and not more than 50 mass %. Tin (Sn) or indium (In) reduce the melting point of the bonding brazing material.

It is favorable for the thickness of the bonding layer 3 to be not less than 5 vim and not more than 60 vim. When the thickness of the bonding layer 3 is less than 5 μm, there is a possibility that the unevenness of the substrate 1 surface may affect the surface of the bonding layer 3; and the uniform bonding between the bonding layer 3 and the substrate 1 may be obstructed. When the thickness of the bonding layer 3 is greater than 60 μm, there is a possibility that the function of relaxing the thermal stress when subjected to thermal cycles may be insufficient, and the strength may decrease. Also, there is a possibility that it may be difficult to etch the bonding layer 3 when etching the metal member 2 and the bonding layer 3. Therefore, it is favorable for the thickness of the bonding layer 3 to be not less than 5 μm and not more than 60 μm, and more favorably not less than 10 μm and not more than 35 μm.

One metal member 2 that is bonded to the substrate 1 is shown in FIG. 1. The bonded body 100 according to the embodiment is not limited to this example; multiple metal members 2 may be bonded to one surface of the substrate 1. One or more metal members 2 may be bonded to one surface of the substrate 1; and another one or more metal members 2 may be bonded to the surface on the opposite side of the substrate 1.

Figure 2:
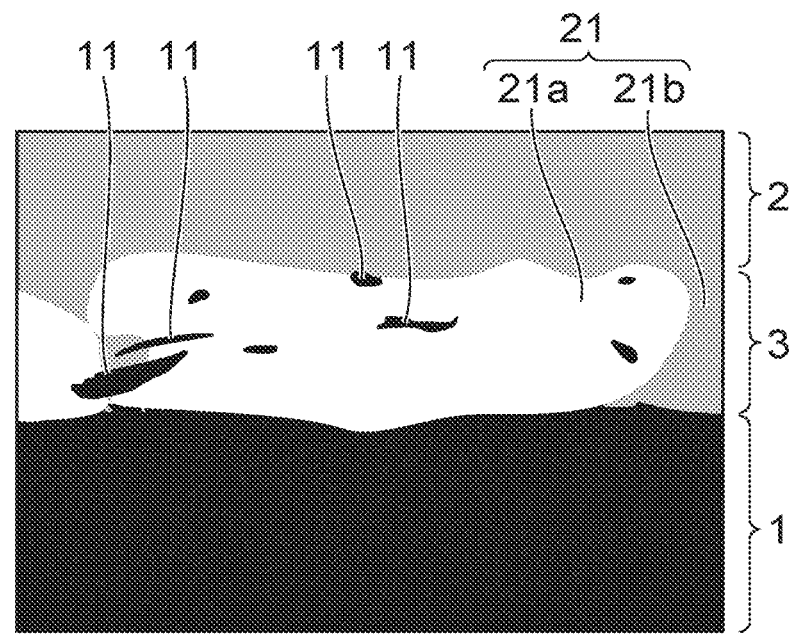
FIG. 2 is an enlarged schematic cross-sectional view of a portion of the bonded body shown in FIG. 1.

FIG. 2 is an enlarged schematic cross-sectional view of a portion of the bonded body shown in FIG. 1. FIG. 2 is an enlarged view of portion P1 of FIG. 1.

As shown in FIG. 2, the bonding layer 3 includes a first particle 11 and a first region 21. The first particle 11 includes carbon. The first region 21 includes a low melting-point metal. The first region 21 is disposed around the first particle 11. For example, a powder body 10, which is described below, includes the first particle 11. The powder body 10 includes a second region 22 that is disposed around the first particle 11. The second region 22 of the powder body 10 contacts the first region 21.

Multiple first particles 11 are provided in the first region 21. At least two of the multiple first particles 11 are separated from each other. For example, the first particles 11 are dispersed in the first region 21.

The first region 21 includes, for example, a first partial region 21a that includes silver, and a second partial region 21b that includes copper. For example, the first partial region 21a is a silver-rich phase that includes much silver. The content of silver in the first partial region 21a is greater than the content of copper in the first partial region 21a. For example, the second partial region 21b is a copper-rich phase that includes much copper. The content of copper in the second partial region 21b is greater than the content of silver in the second partial region 21b.

Figure 3:
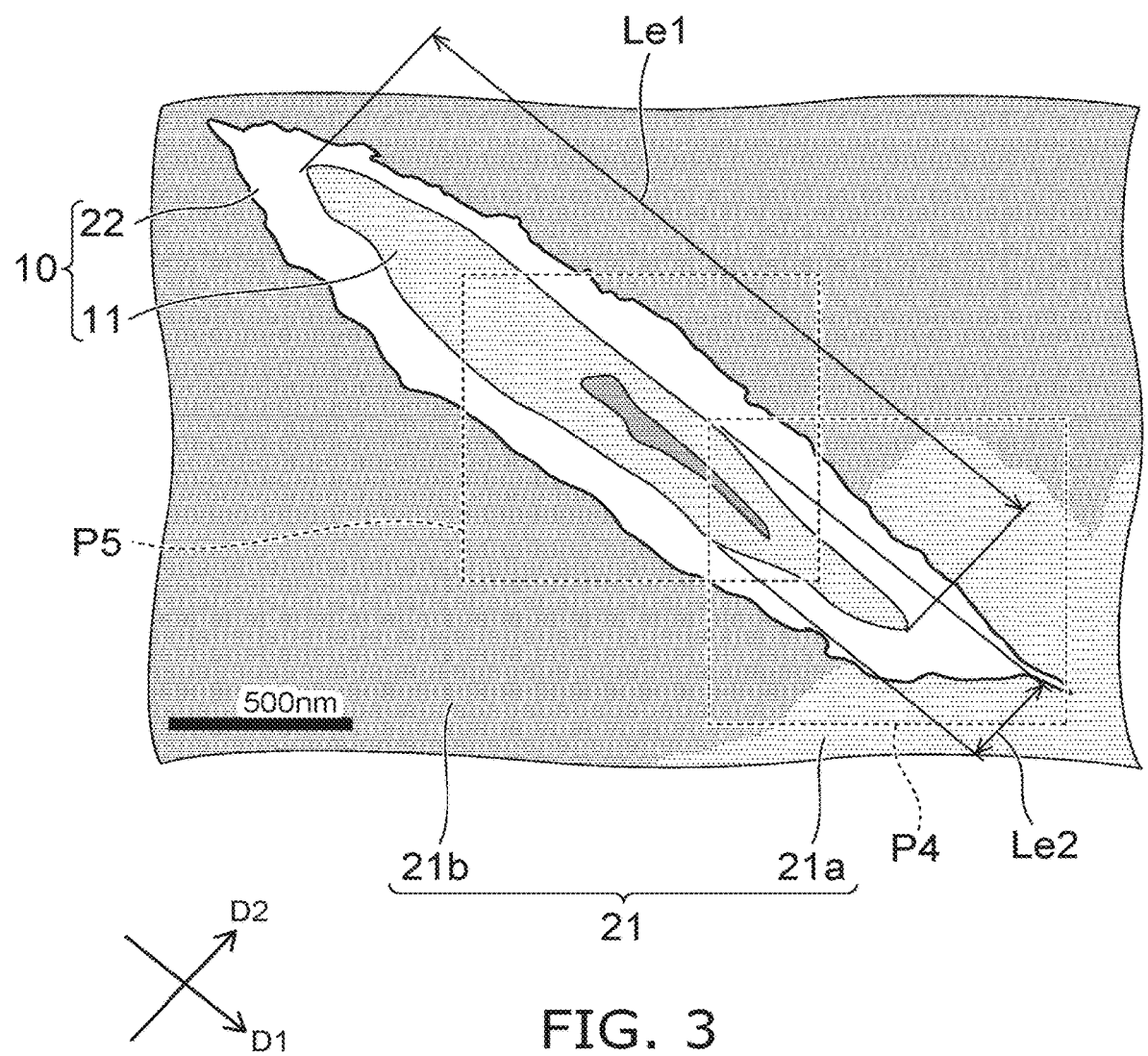
FIG. 3 is a schematic cross-sectional view showing a portion of the bonded body according to the embodiment.
Figure 6:
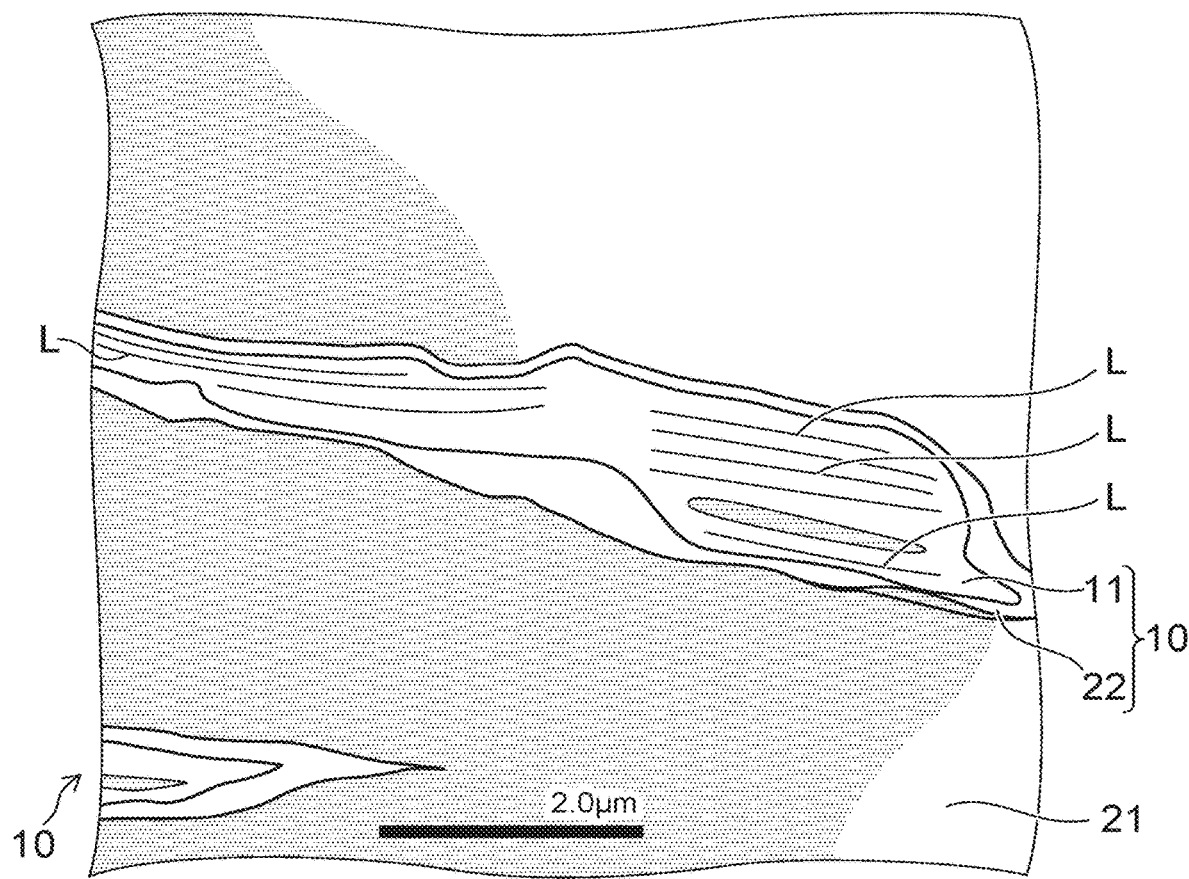
FIG. 6 is a schematic cross-sectional view showing a portion of the bonded body according to the embodiment.
Figure 7:
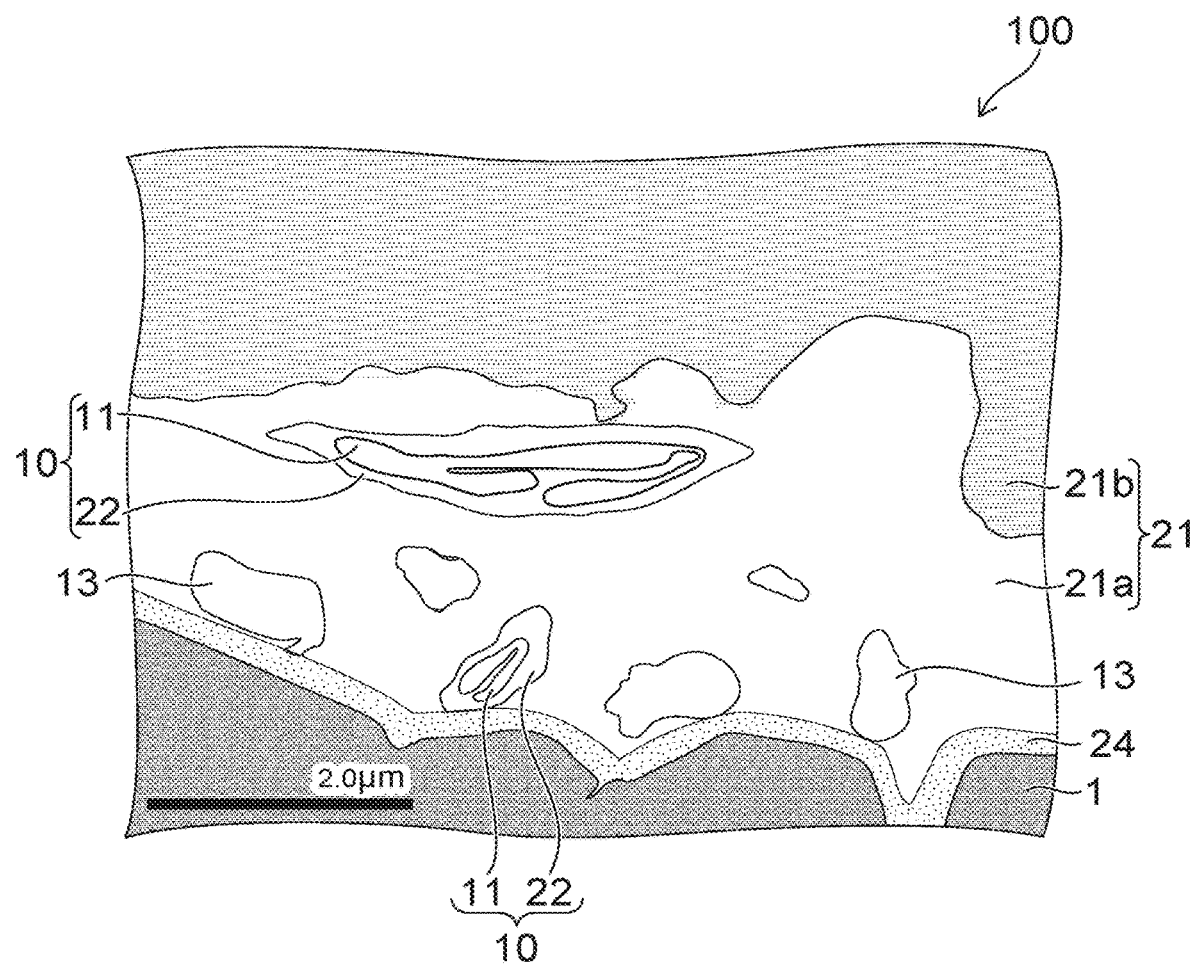
FIG. 7 is a schematic cross-sectional view showing a portion of the bonded body according to the embodiment.

FIGS. 3, 6, and 7 are schematic cross-sectional views showing portions of the bonded body according to the embodiment.

Figure 4:
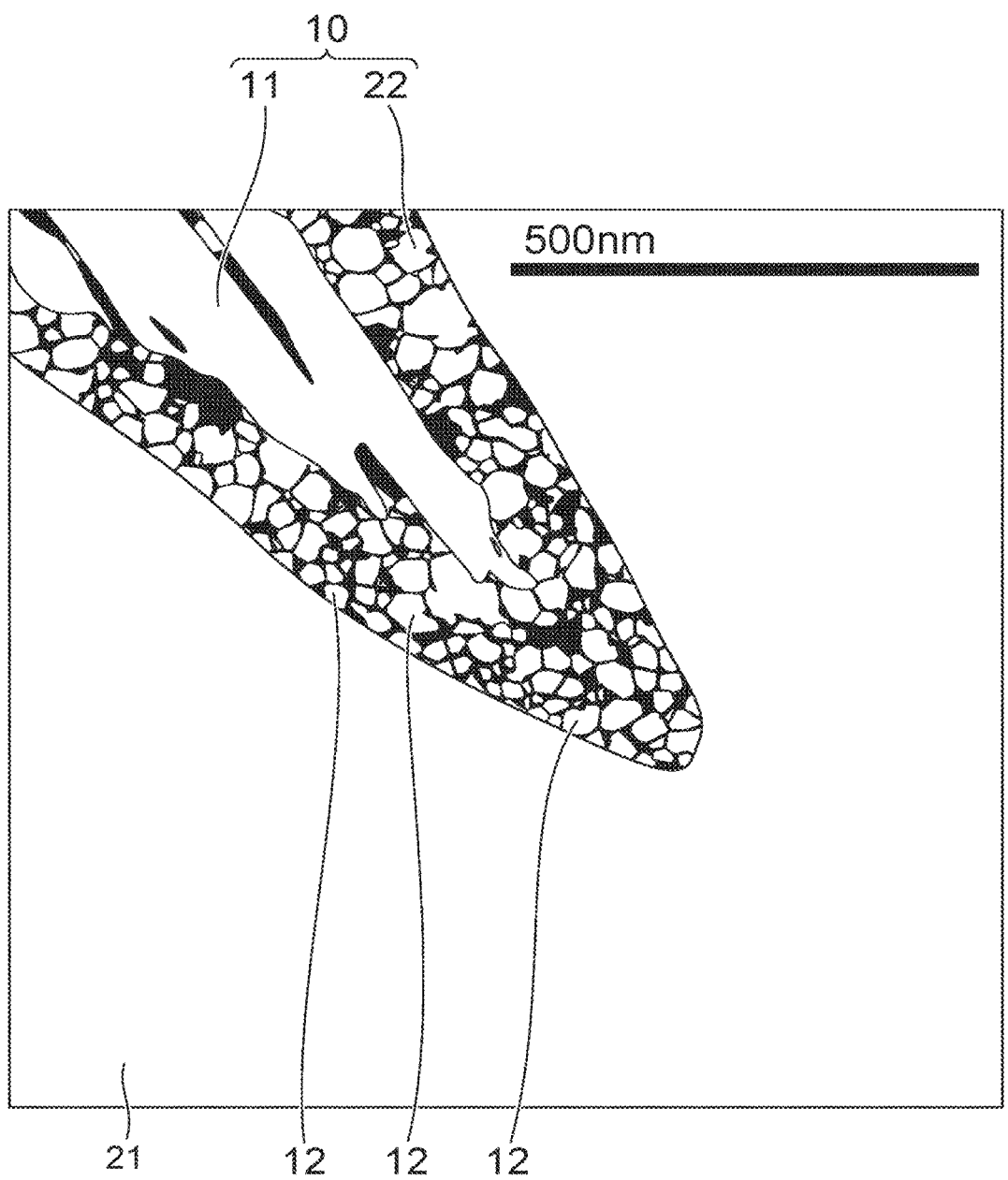
FIG. 4 is an enlarged schematic cross-sectional view of a portion of the bonded body shown in FIG. 3.
Figure 5:
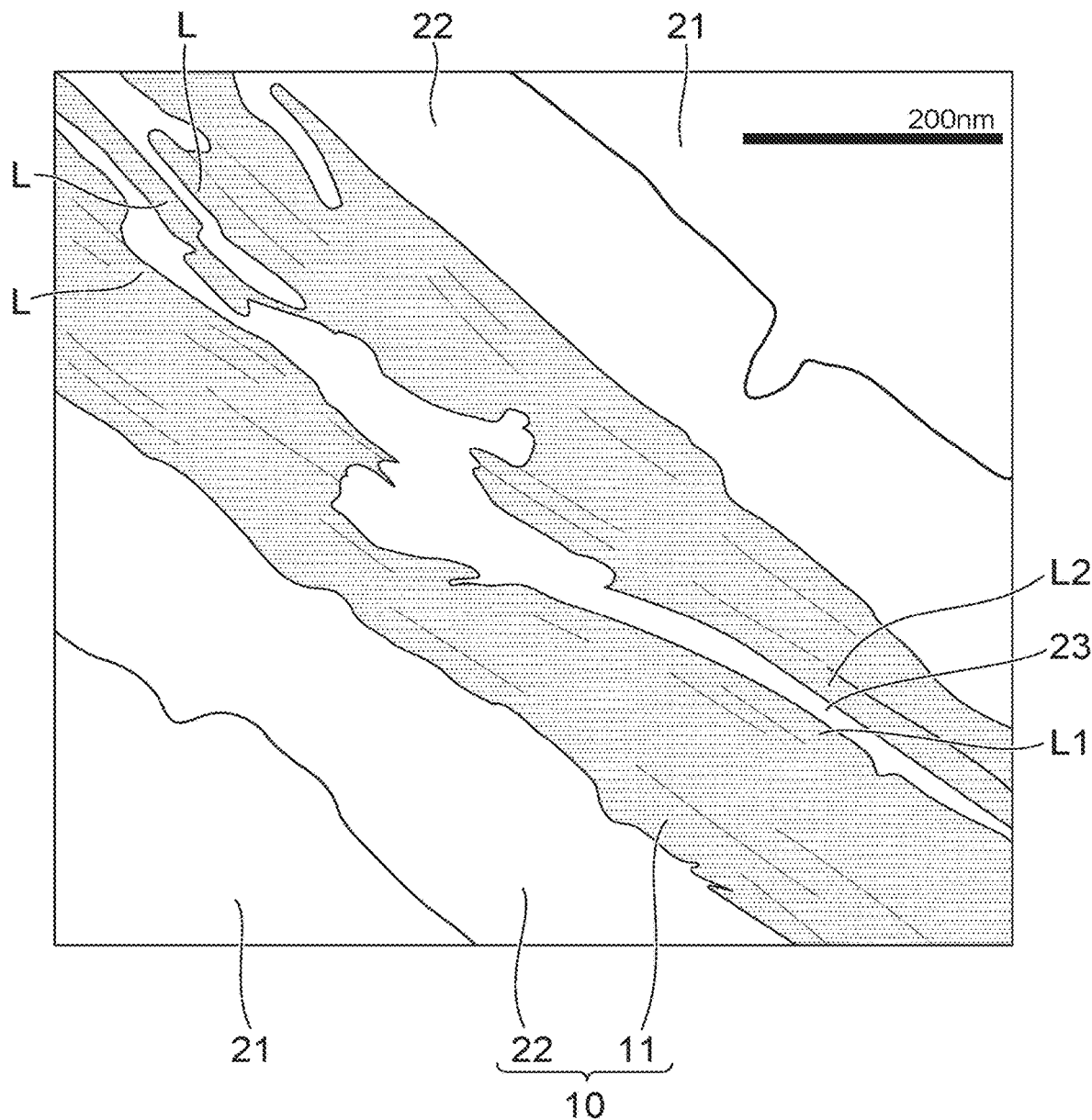
FIG. 5 is an enlarged schematic cross-sectional view of a portion of the bonded body shown in FIG. 3.

FIGS. 4 and 5 are enlarged schematic cross-sectional views of portions of the bonded body shown in FIG. 3.

FIGS. 3, 6, and 7 are enlarged views of the first particle 11 vicinity. FIG. 4 is an enlarged view of portion P4 of FIG. 3. FIG. 5 is an enlarged view of portion P5 of FIG. 3.

As shown in FIG. 3, the second region 22 is disposed between the first particle 11 and the first region 21. The second region 22 exists around the first particle 11. That is, the first region 21 is disposed around the powder body 10 that includes the first particle 11 and the second region 22. For example, the second region 22 surrounds the entire outer edge of the first particle 11. The second region 22 includes titanium and is disposed between the first particle 11 and the first region 21. A concentration a (mass %) of titanium in the second region 22 is greater than a concentration b (mass %) of titanium in the first region 21 and greater than a concentration c (mass %) of titanium in the first particle 11. That is, concentration a>concentration b, and concentration a>concentration c. The concentration c of titanium in the first particle 11 is not more than 50% of the concentration a of titanium in the second region 22, favorably not more than 25%, and more favorably not more than 10%. Also, the concentration b of titanium in the first region 21 is not more than 80% of the concentration a of titanium in the second region 22, favorably not more than 70%, and more favorably not more than 50%.

As shown in FIG. 4, the second region 22 includes multiple second particles 12. The first particle 11 is surrounded with the multiple second particles 12. At least one of the multiple second particles 12 includes at least one selected from the group consisting of titanium, oxygen, nitrogen, and carbon. For example, at least one of the multiple second particles 12 includes a crystal including titanium and at least one selected from the group consisting of oxygen, nitrogen, and carbon. For example, each second particle 12 is a crystal grain of titanium nitride, titanium oxide, titanium oxynitride, etc. The size of at least one of the multiple second particles 12 is less than the size of the first particle 11. In the example of FIG. 4, the shape of the second particle 12 is granular. The shape of the second particle 12 may be a shape other than the illustrated shape such as a needle-like configuration, etc.

As shown in FIGS. 5 and 6, the first particle 11 includes multiple layers L of carbon. For example, the multiple layers L include a first layer L1 and a second layer L2. As in the example shown in FIG. 5, the first layer L1 and the second layer L2 may be separated from each other. A third region 23 is provided between the first layer L1 and the second layer L2.

The third region 23 includes a low melting-point metal. The metallic element included in the third region 23 may be the same as the metallic element included in the first region 21. The third region 23 may include an element supplied from the substrate. That is, the third region 23 may include at least one element of the same type as an element included in the substrate. For example, when the first region 21 includes silver and copper, the third region 23 includes at least one selected from the group consisting of silver and copper.

At least one of the multiple layers L is, for example, crystalline. The layer L includes, for example, a graphite crystal. Carbon is regularly ordered in the graphite crystal. The first layer L1 and the second layer L2 are disposed along a first direction D1. The shape of the first particle 11 is, for example, flattened as shown in FIG. 3. There is also a possibility that the shape of the first particle 11 may be circular according to the position of the cross section. When the first particle 11 has a flattened shaped, a length Le1 of the first particle 11 in the first direction D1 is, for example, not less than 1.2 times and not more than 40 times a length Le2 of the first particle 11 in a second direction D2 crossing the first direction D1. For example, the second direction is the direction in which the length Le2 is shortest in one cross section.

The method for measuring the lengths Le1 and Le2 of the first particle 11 and the calculation method of the ratio of the length Le1 to the length Le2 will now be described. The cross section of the bonding layer 3 is imaged using a scanning electron microscope (Scanning Electron Microscope; SEM) in an enlarged photograph having a unit area of 15 μm in the thickness direction×100 μm in the surface direction. The thickness direction corresponds to the direction connecting the substrate 1 and the metal member 2. The surface direction is one direction perpendicular to the thickness direction. The magnification of the SEM photograph is set to "1000 times". For each of the first particles 11 visible in the SEM photograph, the distance between the two points most separated on the outer edge of the first particle 11 is taken as the length Le1. The length of the first particle 11 along a line segment that is perpendicular to a line segment connecting the two points and passing through the midpoint of the line segment is taken as the length Le2. The lengths Le1 and Le2 are measured for each of the first particles 11 observable in one field. The ratio (Le1/Le2) of the length Le1 to the length Le2 is calculated for the lengths Le1 and Le2 of each of the first particles 11. By performing this operation for three fields, the ratio of the length Le1 to the length Le2 is obtained for each of the fields. The average value of all of the ratios is the ratio of the length Le1 to the length Le2 of the bonded body 100. The ratio is not less than 1.2 and not more than 40.

The second region 22 contacts the first partial region 21a. The second region 22 may contact the second partial region 21b, or may not contact the second partial region 21b.

Multiple powder bodies 10 that are composite particles including the first particle 11 and the second region 22 are provided in the bonding layer 3. At least two of the multiple powder bodies 10 are separated from each other. For example, the powder bodies 10 are dispersed in the first region 21.

As shown in FIG. 7, the bonding layer 3 may include a fourth region 24 that includes titanium and nitrogen. The fourth region 24 is positioned between the substrate 1 and the first region 21. The powder body 10 may be separated from or may contact the fourth region 24. For example, the ratio of the number of the powder bodies 10 separated from the fourth region 24 to the number of the powder bodies 10 contacting the fourth region 24 is not less than 9.0. A 30 μm×200 μm region is observed by SEM; and the ratio is calculated based on the powder bodies 10 existing in the observation region. The observation region is set so that the fourth region 24 can be continuously confirmed from any one side to the side opposite to the one side. When the powder body 10 is separated from the fourth region 24, the first partial region 21a or the second partial region 21b is positioned between the powder body 10 and the fourth region 24.

As shown in FIG. 7, the bonding layer 3 may include a third particle 13. The third particle 13 includes at least one selected from the group consisting of titanium, silicon, and tin. For example, the multiple third particles 13 are dispersed in the first region 21. The third particle 13 may contact the fourth region 24.

For example, the structures and the sizes of the first particle 11 and the second region 22 can be confirmed using SEM, a transmission electron microscope (Transmission Electron Microscope; TEM), or a scanning transmission electron microscope (Scanning Transmission Electron Microscope; STEM). For example, the elements and the concentrations of the elements included in the first particle 11, the first region 21, and the second region 22 can be confirmed using elemental mapping by STEM.

For example, the bonded body 100 according to the embodiment is manufactured by the following method.

First, the substrate 1 is prepared. A brazing material paste is coated onto the upper surface of the substrate 1. The brazing material paste includes silver, copper, titanium, and carbon. The metal member 2 is disposed on the brazing material paste. It is favorable for the thickness of the brazing material paste to be not less than 5 μm and not more than 60 μm, and more favorably not less than 10 μm and not more than 40 μm. When the coating thickness is less than 5 μm, there is a possibility that the brazing material may be insufficient; and the bonding strength may decrease. When the coating thickness is greater than 60 μm, the coating difficulty increases, and it becomes difficult to coat the brazing material paste with high uniformity. When coating unevenness of the brazing material paste occurs, there is a possibility that the bonding strength between the substrate 1 and the metal member 2 may decrease. When the metal member 2 is provided at both the upper surface and the lower surface of the substrate 1, the brazing material paste is coated onto both the upper surface and the lower surface of the substrate 1.

The substrate 1 on which the metal member 2 is provided is heated. Initially, heating is performed to the vicinity of 500° C. at a pressure 13.3 Pa in a nitrogen atmosphere. The substrate 1 is heated for not less than 30 minutes by holding the temperature in the range of 480° C. to 500° C. At this time, the binding component that is included in the brazing material paste melts; and carbon remains without melting. Particles that include titanium cluster around the remaining carbon. Thereby, multiple particles that include titanium are disposed around particles including carbon. It is favorable for the pressure in the nitrogen atmosphere to be in the range not less than 0.01 Pa and not more than atmospheric pressure. Atmospheric pressure is 1 atmosphere (0.101325 MPa). It is more favorable for the pressure to be not less than 5 Pa. Also, the nitrogen atmosphere refers to the nitrogen concentration in the gas existing in the processing space being not less than 50 vol %. It is favorable for the nitrogen concentration in the nitrogen atmosphere to be not less than 70 vol %. Other than nitrogen, the nitrogen atmosphere may include an inert gas such as oxygen or a noble gas. For example, the nitrogen atmosphere may be obtained by depressurizing air. At least a portion of the air may be replaced with nitrogen gas or a gas mixture of nitrogen gas and noble gas. Favorably, the percentage of the noble gas to the gas other than nitrogen in the nitrogen atmosphere is not less than 0.5 vol %.

Then, the pressure is depressurized to be not more than $10^{-3}$ Pa. The substrate 1 is heated for not less than 30 minutes by holding the temperature in the range from 550° C. to 600° C. The multiple particles that include titanium are stabilized by this processing. Continuing, the substrate 1 is heated for not less than 10 minutes, and favorably not less than 30 minutes by holding the temperature in a range from 700° C. to 950° C. The metal that is included in the brazing material paste is melted thereby, and the substrate 1 and the metal member 2 are bonded.

Subsequently, an etching process of the metal member 2 may be performed. The metal member 2 is patterned by the etching process. When the bonded body 100 is used as a semiconductor circuit board, one or more metal members 2 that are bonded to the substrate 1 are patterned into a patterned configuration (a circuit configuration).

Figure 8:
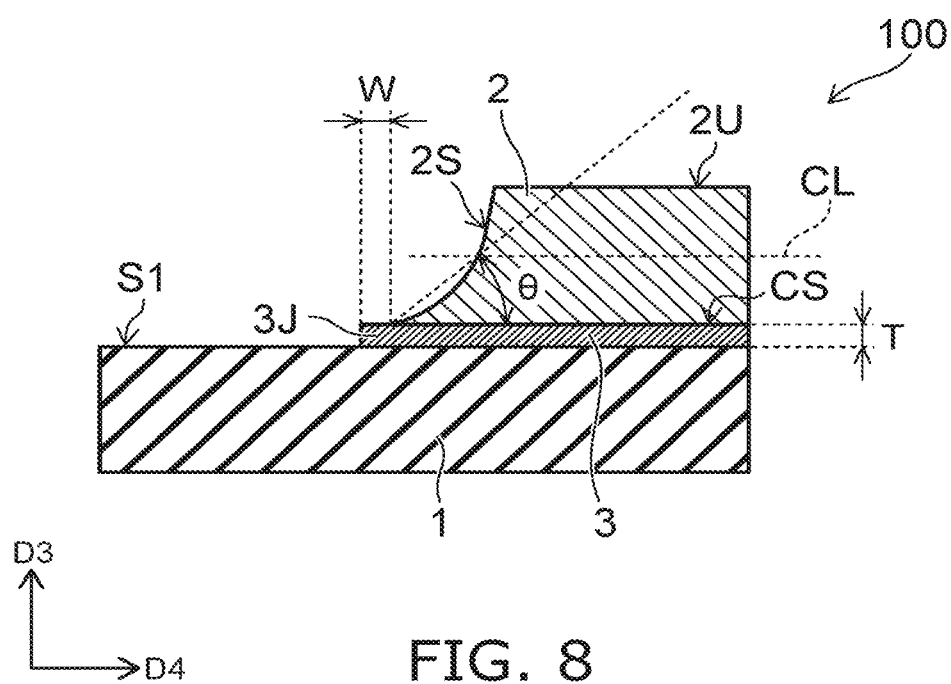
FIG. 8 is a schematic cross-sectional view showing a portion of the bonded body according to the embodiment.

FIG. 8 is a schematic cross-sectional view showing a portion of the bonded body according to the embodiment.

FIG. 8 shows an example of the metal member 2 after patterning. For example, the substrate 1 includes a first surface S1. The metal member 2 is bonded to the first surface S1 via the bonding layer 3.

It is favorable for at least a portion of a side surface 2S of the metal member 2 after the patterning to be oblique to a third direction D3 perpendicular to the first surface S1 as shown in FIG. 8. Also, it is favorable for a portion of the bonding layer 3 not to be interposed between the substrate 1 and the metal member 2 in the third direction D3. In other words, it is favorable for the bonding layer 3 to include a jutting portion 33 that juts from between the substrate 1 and the metal member 2. Because the side surface 2S is oblique and the jutting portion 33 is provided, the stress of the substrate 1 and the metal member 2 can be relaxed. The TCT characteristics can be improved thereby.

It is favorable for a length W of the jutting portion 33 in a fourth direction D4 crossing the third direction D3 to be not less than 10 win and not more than 150 μm. For example, the fourth direction D4 is parallel to the first surface S1. It is favorable for the ratio of the length W of the jutting portion 33 to a thickness T of the jutting portion 33 to be not less than 0.5 and not more than 3.0. More favorably, the ratio of the length W to the thickness T is not less than 1.0 and not more than 2.0. The thickness T of the jutting portion 33 corresponds to the length in the third direction D3 of the jutting portion 33. By controlling the length W and the thickness T of the jutting portion 33, the directionality of the thermal stress (the contraction and the expansion) can be more uniform. The occurrence of cracks in the substrate 1 and the bonding layer 3 can be suppressed thereby.

The metal member 2 contacts the bonding layer 3 at a contact surface CS. A line segment that passes through the thickness direction (the third direction D3) center of the metal member 2 is taken as a center line CL. The center line CL crosses the side surface 2S at an intersection IS. A slope angle θ1 of the side surface 2S is represented by the angle with respect to the third direction D3 of a line segment connecting the intersection IS and the end portion of the contact surface CS. It is favorable for the slope angle θ1 to be not less than 40 degrees and not more than 84 degrees.

It is favorable for an angle θ2 of the upper end portion of the metal member 2 to be not less than 85 degrees and not more than 95 degrees. The angle θ2 is represented by the angle between the side surface 2S and an upper surface 2U of the metal member 2. This structure is particularly effective when the thickness of the metal member 2 is not less than 0.6 mm, and more effective when not less than 0.8 mm. By setting the slope angle θ1 to be 40 to 84 degrees and the angle θ2 to be 85 to 95 degrees, the surface area of the flat upper surface 2U can be increased while relaxing the stress. When the surface area of the upper surface 2U is increased, the surface area on which semiconductor elements can be mounted can be wide. By widening the surface area on which semiconductor elements can be mounted, the degrees of freedom of the circuit design can be increased. In other words, the bonded body according to the embodiment is favorable for a circuit board.

When thermal stress is applied to the bonded body 100, the weak portions are initially fractured. By using a ceramic substrate that has a three-point bending strength that is not less than 500 MPa as the substrate 1, the occurrence of cracks in the substrate 1 can be suppressed. When the strength of the substrate 1 is low, cracks easily occur in the substrate 1 due to the thermal stress. When the substrate 1 includes a nitride material, titanium nitride is formed when bonding by a reaction of the nitrogen of the substrate 1 and the titanium of the bonding layer 3. The bonding strength of the bonded body 100 can be increased by the formation of titanium nitride. The bonding strength of the bonded body 100 can be increased by the melting and diffusing at the interface between the metal member 2 and the bonding layer 3 when bonding. When the bonding at the interface of the bonding layer 3 is strong, the thermal stress concentrates in the bonding layer 3 interior. Therefore, it is desirable for the strength of the bonding layer 3 to be high.

In the bonded body 100 according to the embodiment, the bonding layer 3 includes the first particle 11, the first region 21, and the second region 22. The first particle 11 includes carbon. The wettability of carbon with metal is not good. In other words, the wettability of the first particle 11 with the first region 21 is not good. When locations where the wettability is poor exist inside the bonding layer 3, voids may occur at such locations and may become starting points of cracks. As a result, there is a possibility that the strength of the bonding layer 3 may decrease.

In the bonded body 100, the second region 22 that includes titanium is disposed between the first particle 11 and the first region 21. In addition to titanium, the second region 22 includes an element supplied from the substrate 1 such as nitrogen, oxygen, carbon, etc. Therefore, much of the titanium exists not in a metal form, but in the form of an inorganic substance such as an oxide, a nitride, an oxynitride, a carbide, etc. By providing the second region 22 that is such an inorganic substance, both the interface between the first particle 11 and the second region 22 and the interface between the first region 21 and the second region 22 are favorably formed. In other words, the wettability between the first particle 11 and the first region 21 is improved. As a result, the strength of the bonding layer 3 can be increased.

Also, the second region 22 is disposed around the first particle 11. The second region 22 includes the multiple second particles 12. The first particle 11 and the multiple second particles 12 form one aggregate as the powder body 10. By providing the powder body 10 in which multiple particles are clustered in the bonding layer 3, the occurrence of cracks is suppressed in the locations where the powder body 10 is provided. Therefore, the strength of the bonding layer 3 increases.

When one cross section of the bonding layer 3 is observed, it is favorable for the second region 22 to cover not less than 90% of the surface of the first particle 11. More favorably, the second region 22 covers not less than 95% of the surface of the first particle 11. Because the second region 22 covers a wider area of the surface of the first particle 11, the occurrence of voids around the first particle 11 can be suppressed. The strength of the bonding layer 3 is increased thereby.

It is favorable for the thickness of the second region 22 to be not less than 2 nm and not more than 1 µm. More favorably, the thickness of the second region 22 is not less than 10 nm and not more than 500 nm. When the thickness is less than 2 nm, the effect of improving the wettability weakens. Also, to form the second region 22 to have a thickness greater than 1 µm, it is necessary for the titanium component to be plentiful. When a plentiful titanium component is used in the formation of the second region 22, there is a possibility that the titanium nitride layer formed at the interface between the substrate 1 and the bonding layer 3 may become thin, and the bonding strength between the substrate 1 and the bonding layer 3 may decrease.

It is favorable for the content ratio of titanium in the second region 22 to be not less than 50 mass %. More favorably, the content ratio of titanium in the second region 22 is not less than 60 mass %. It is favorable for the second region 22 to include titanium and nitrogen. For example, at least one second particle 12 included in the second region 22 includes titanium and nitrogen. The second particle 12 may further include oxygen. Favorably, at least one second particle includes a crystal including titanium and at least one selected from the group consisting of nitrogen and oxygen. Because the second particle 12 includes a crystal, the stress that is generated in the bonding layer 3 can be relaxed.

It is favorable for the second region 22 to be disposed around each of the multiple first particles 11. It is favorable for the percentage of the number of the first particles 11 around which the second region 22 is not provided to the total number of the first particles 11 in one cross section to be not more than 5%. More favorably, the percentage is not more than 3%. When the percentage is greater than 5%, there is a possibility that voids may easily occur, and the strength of the bonding layer 3 may decrease.

It is favorable for five or more pieces of the powder body 10 to exist in an area of 15 µm in the thickness direction×100 µm the surface direction in the cross section of the bonding layer 3. More favorably, it is favorable for ten or more pieces of the powder body 10 to exist in the area. The thickness direction corresponds to the third direction D3 shown in FIG. 8. The surface direction corresponds to the fourth direction D4 shown in FIG. 8. The strength of the bonding layer 3 can be further increased as the number of the powder bodies 10 is increased.

Figure 9A:
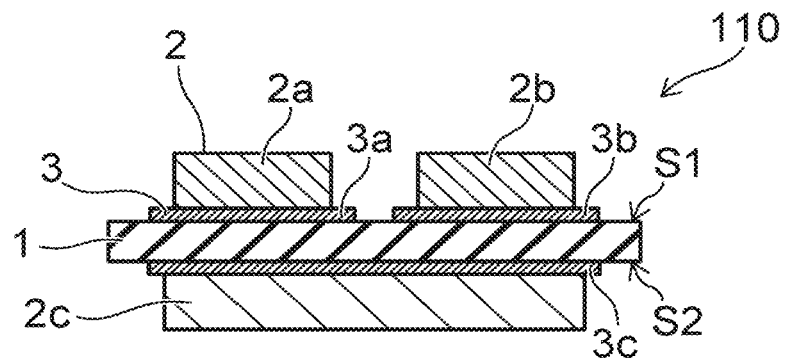
FIGS. 9A to 9C are schematic cross-sectional views showing the bonded bodies according to the embodiment.
Figure 9B:
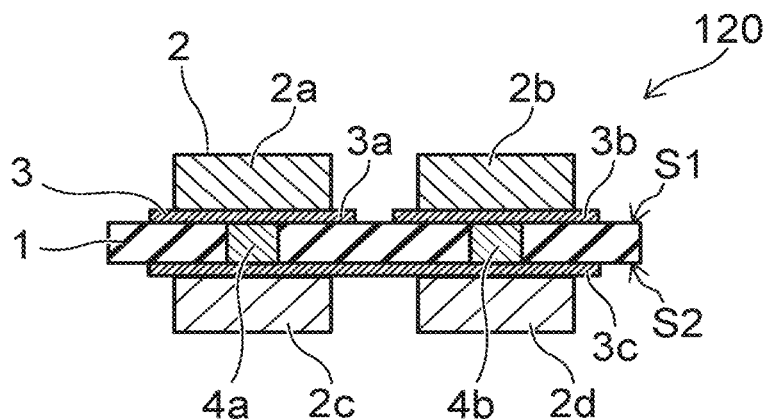
Figure 9C:
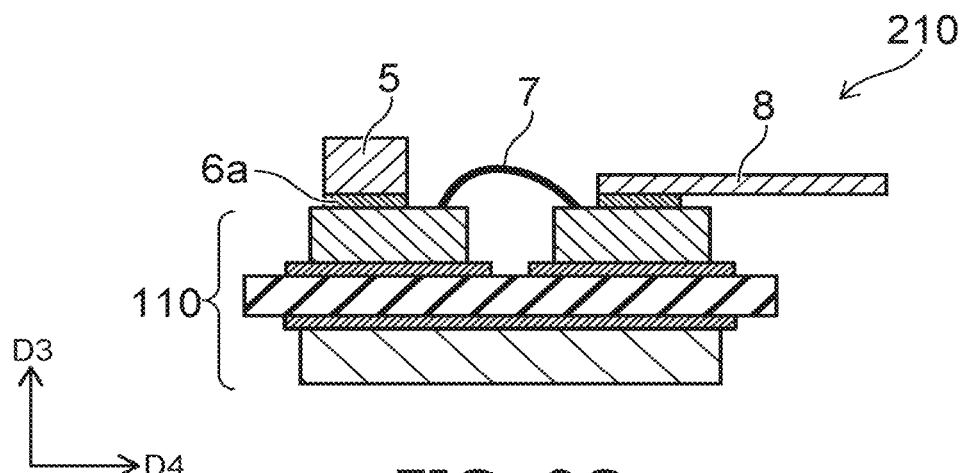

FIGS. 9A to 9C are schematic cross-sectional views showing bonded bodies according to the embodiment.

A bonded body 110 shown in FIG. 9A includes the substrate 1, the multiple metal members 2, and the multiple bonding layers 3. The multiple metal members 2 include a first metal member 2a, a second metal member 2b, and a third metal member 2c. The multiple bonding layers 3 include a first bonding layer 3a, a second bonding layer 3b, and a third bonding layer 3c.

The substrate 1 includes the first surface S1 and a second surface S2. The first metal member 2a is separated from the second metal member 2b in the second direction D2 along the first surface S1. The first metal member 2a may be linked to the second metal member 2b at a not-illustrated portion. The first metal member 2a and the second metal member 2b are bonded to the first surface S1 respectively via the first bonding layer 3a and the second bonding layer 3b. The third metal member 2c is bonded to the second surface S2 via the third bonding layer 3c.

Compared to the bonded body 110, a bonded body 120 shown in FIG. 9B further includes a fourth metal member 2d, a first connector 4a, and a second connector 4b. The third metal member 2c is separated from the fourth metal member 2d in the second direction D2. The third metal member 2c may be linked to the fourth metal member 2d at a not-illustrated portion. The fourth metal member 2d is bonded to the second surface S2 via the third bonding layer 3c.

The first connector 4a and the second connector 4b are located in the substrate 1. The first connector 4a is located between the first bonding layer 3a and the third bonding layer 3c in the first direction D1 and is electrically connected with these bonding layers. The second connector 4b is located between the second bonding layer 3b and the third bonding layer 3c in the first direction D1 and is electrically connected with these bonding layers.

FIG. 9C shows a semiconductor device 210 that uses the bonded body 110 according to the embodiment. The semiconductor device 210 includes the bonded body 110, a semiconductor element 5, and a bonding layer 6a. The semiconductor element 5 is bonded to the first metal member 2a via the bonding layer 6a. The first metal member 2a is positioned between the substrate 1 and the semiconductor element 5 in the first direction D1.

The semiconductor device 210 may further include a bonding wire 7 and a metal terminal 8. The metal terminal 8 is bonded to the second metal member 2b via a bonding layer 6b. The second metal member 2b is positioned between the substrate 1 and the metal terminal 8 in the first direction D1. The bonding wire 7 connects the first metal member 2a and the second metal member 2b. The compositions and the structures of the bonding layers 6a and 6b may be the same as or different from the composition and the structure of the bonding layer 3.

Specific examples of the bonded bodies according to embodiments will now be described.

For example, the two substrates shown in Table 1 are used as the substrate 1.

TABLE 1

| | Material | Substrate size(mm) | Three-point bending strength(MPa) |
|---|---|---|---|
| Substrate A | Silicon nitride | 50 × 40 × 0.3 | 620 |
| Substrate B | Silicon nitride | 50 × 40 × 0.25 | 710 |

For example, the four brazing materials shown in Table 2 are used as the material of the bonding layer 3.

TABLE 2

| | Brazing material component (mass %) |
|---|---|
| Brazing material 1 | Ag (70), Cu (29), Ti (1) |
| Brazing material 2 | Ag(61), Cu(24), In(8.5), Ti(5), C(1.5) |
| Brazing material 3 | Ag(50), Cu(28), Sn(11), In(3), Ti(7), C(1) |
| Brazing material 4 | Ag(47.5), Cu(37), Sn(7), Ti(8), C(0.5) |
| Brazing material 5 | Ag(47.5), Cu(36.5), Sn(7), Ti(8), C(1) |
| Brazing material 6 | Ag(50), Cu(28.9), Sn(11), In(3), Ti(7), C(0.1) |

For example, a copper plate having a thickness of 0.8 mm is used as the metal member 2. A brazing material paste is coated onto the upper surface and the lower surface of the substrate 1. The thickness of the brazing material paste is 25 μm. Metal members are disposed at and bonded to the upper surface and the lower surface. The metal member that is disposed at the upper surface is patterned by etching. The heat treatment when bonding the substrate 1 and the metal member 2 is performed using the following seven conditions.

For the heat treatment conditions 3 to 6, the atmosphere, the pressure, and the holding time when holding the temperature of the substrate 1 at about 600° C. are common to the heat treatment condition 2. Also, the atmosphere and the pressure when holding the temperature of the substrate 1 at not less than 700° C. and not more than 850° C. are common to the heat treatment condition 2. For the heat treatment condition 7, the temperature of the substrate 1 is held to be not less than 850° C. and not more than 950° C.

(Heat Treatment Condition 1)

The substrate 1 is heated for 30 minutes by holding the temperature of the substrate 1 at not less than 700° C. and not more than 850° C. in a non-oxidative atmosphere that is not more than $1 \times 10^{-3}$ Pa. The non-oxidative atmosphere refers to the oxygen concentration in the gas existing in the processing space being not more than 25 vol %.

(Heat Treatment Condition 2)

Initially, the substrate 1 is heated for 30 minutes by holding the temperature of the substrate 1 at about 500° C. in a nitrogen atmosphere of 13.3 Pa. The nitrogen concentration in the nitrogen atmosphere is 90 vol %. Then, the substrate 1 is heated for 120 minutes by holding the temperature of the substrate 1 at about 600° C. in a non-oxidative atmosphere that is not more than $1 \times 10^{-3}$ Pa. Subsequently, the substrate 1 is heated for 30 minutes by holding the temperature of the substrate 1 at not less than 700° C. and not more than 850° C. in a non-oxidative atmosphere that is not more than $1 \times 10^{-3}$ Pa.

(Heat Treatment Condition 3)

Initially, the substrate 1 is heated for 30 minutes by holding the temperature of the substrate 1 at about 500° C. in a nitrogen atmosphere of 0.01 Pa. The nitrogen concentration in the nitrogen atmosphere is 99.9 vol %. Then, after heating at about 600° C. in a non-oxidative atmosphere that is not more than $1 \times 10^{-3}$ Pa, the substrate 1 is heated for 30 minutes by holding the temperature of the substrate 1 at not less than 700° C. and not more than 850° C.

(Heat Treatment Condition 4)

Initially, the substrate 1 is heated for 60 minutes by holding the temperature of the substrate 1 at about 500° C. in a nitrogen atmosphere of 0.5 Pa. The nitrogen concentration in the nitrogen atmosphere is 70 vol %. Then, after heating at about 600° C. in a non-oxidative atmosphere that is not more than $1 \times 10^{-3}$ Pa, the substrate 1 is heated for 30 minutes by holding the temperature of the substrate 1 at not less than 700° C. and not more than 850° C.

(Heat Treatment Condition 5)

Initially, the substrate 1 is heated for 120 minutes by holding the temperature of the substrate 1 at about 500° C. in a nitrogen atmosphere of 0.03 Pa. The nitrogen concentration in the nitrogen atmosphere is 80 vol %. Then, after heating at about 600° C. in a non-oxidative atmosphere that is not more than $1 \times 10^{-3}$ Pa, the substrate 1 is heated for 120 minutes by holding the temperature of the substrate 1 at not less than 700° C. and not more than 850° C.

(Heat Treatment Condition 6)

Initially, the substrate 1 is heated for 150 minutes by holding the temperature of the substrate 1 at about 500° C. in a nitrogen atmosphere of 5 Pa. The nitrogen concentration in the nitrogen atmosphere is 70 vol %. Then, after heating at about 600° C. in a non-oxidative atmosphere that is not more than $1 \times 10^{-3}$ Pa, the substrate 1 is heated for 200 minutes by holding the temperature of the substrate 1 at not less than 700° C. and not more than 850° C.

(Heat Treatment Condition 7)

Initially, the substrate 1 is heated for 150 minutes by holding the temperature of the substrate 1 at about 500° C. in a nitrogen atmosphere of 5 Pa. The nitrogen concentration in the nitrogen atmosphere is 90 vol %. Then, after heating at about 600° C. in a non-oxidative atmosphere that is not more than $1 \times 10^{-3}$ Pa, the substrate 1 is heated for 100 minutes by holding the temperature of the substrate 1 at not less than 860° C. and not more than 950° C.

An overview of the heat treatment conditions described above is shown in Table 3.

TABLE 3

| Heat treatment condition | Total pressure(Pa) | N$_2$ % (Nitrogen concentration) | 500° C. Holding time (minutes) | Bonding time (minutes) |
|---|---|---|---|---|
| 3 | 0.01 | 99.9 | 39 | 30 |
| 4 | 0.5 | 70 | 60 | 30 |
| 5 | 0.03 | 80 | 120 | 120 |
| 6 | 5 | 70 | 150 | 200 |
| 7 | 5 | 90 | 150 | 100 |
| 1 | 0.001 | 99 | — | 30 |
| 2 | 13.3 | 90 | 120 | 30 |

For example, the combinations of the type of the substrate 1, the type of the brazing material, and the type of the heat treatment condition are as shown in Table 4.

TABLE 4

| | Substrate | Brazing material composition | Heat treatment condition |
|---|---|---|---|
| Example 1 | Substrate A | Brazing material 2 | Heat treatment 2 |
| Example 2 | Substrate A | Brazing material 3 | Heat treatment 2 |
| Example 3 | Substrate A | Brazing material 4 | Heat treatment 2 |
| Example 4 | Substrate B | Brazing material 2 | Heat treatment 2 |
| Example 5 | Substrate B | Brazing material 3 | Heat treatment 2 |
| Example 6 | Substrate B | Brazing material 4 | Heat treatment 2 |
| Example 7 | Substrate A | Brazing material 1 | Heat treatment 1 |
| Example 8 | Substrate A | Brazing material 5 | Heat treatment 3 |

TABLE 4-continued

| | Substrate | Brazing material composition | Heat treatment condition |
|---|---|---|---|
| Example 9 | Substrate A | Brazing material 5 | Heat treatment 4 |
| Example 10 | Substrate A | Brazing material 6 | Heat treatment 5 |
| Example 11 | Substrate A | Brazing material 6 | Heat treatment 6 |
| Example 12 | Substrate A | Brazing material 6 | Heat treatment 7 |

A peel strength was measured and TCT was performed for the bonded bodies according to the examples. The peel strength was measured by bonding the metal member 2 having a width of 1 mm to the substrate 1 and by pulling the metal member 2 in the vertical direction. For TCT, the existence or absence of discrepancies was measured for the bonded bodies after 5000 cycles. In one cycle, hold for 30 minutes at −50° C.→hold for 10 minutes at room temperature→hold for 30 minutes at 200° C.→hold for 10 minutes at room temperature were performed. The discrepancies of the bonded bodies were determined by using an ultrasonic flaw detection device (Scanning Acoustic Tomograph: SAT) of the crack occurrence area between the substrate 1 and the metal member 2. The crack occurrence area was evaluated using an index η. η being 100% indicates "no cracks", and 0% indicates "crack occurrence over the entire surface". The results are shown in Table 5.

TABLE 5

| | Peel strength kN/m | η % |
|---|---|---|
| Example 1 | 24 | 98 |
| Example 2 | 27 | 99 |
| Example 3 | 29 | 100 |
| Example 4 | 24 | 99 |
| Example 5 | 27 | 100 |
| Example 6 | 29 | 100 |
| Example 7 | 16 | 10 |
| Example 8 | 32 | 100 |
| Example 9 | 31 | 99 |
| Example 10 | 23 | 100 |
| Example 11 | 21 | 98 |
| Example 12 | 22 | 99 |

It can be seen from the results of Table 5 that compared to when the brazing material 1 and the heat treatment condition 1 are used, the peel strength can be increased and the occurrence of cracks can be suppressed when using the heat treatment condition 2 and one of the brazing materials 2 to 4. Compared to the brazing material 1, the brazing materials 2 to 4 further include carbon (C). The inventors conjectured that carbon contributes to the improvement of the characteristics. Based on this conjecture, the inventors performed observations of the particles that include carbon in the bonding layer 3. Table 6 shows the results of electron microscope observations of the cross section of the bonding layer 3 for each of the examples 1 to 7. The number of powder bodies was measured in a 15 μm×100 μm area.

TABLE 6

| | Existence of powder body | Number of powder bodies (pieces) | Thickness | Coverage |
|---|---|---|---|---|
| Example 1 | Yes | 10 | 55 nm | 100% |
| Example 2 | Yes | 18 | 70 nm | 100% |
| Example 3 | Yes | 22 | 100 nm | 100% |
| Example 4 | Yes | 11 | 60 nm | 100% |
| Example 5 | Yes | 17 | 72 nm | 100% |
| Example 6 | Yes | 21 | 95 nm | 100% |
| Example 7 | No | — | — | — |
| Example 8 | Yes | 30 | 65 nm | 100% |
| Example 9 | Yes | 30 | 70 nm | 95% |
| Example 10 | Yes | 5 | 500 nm | 98% |
| Example 11 | Yes | 5 | 700 nm | 90% |
| Example 12 | Yes | 6 | 480 nm | 97% |

The thickness shown in Table 6 is the thickness of the second region 22. The thickness of the second region 22 is measured by the following method. The thickness of the second region 22 existing around each first particle 11 is measured in one direction from the first particle 11 toward the first region 21. The direction is randomly determined. The thickness of each second region 22 is measured as follows. An AMC cross section is patterned and observed by TEM. Three locations of the second region 22 are randomly selected as the measurement locations. The thicknesses of the measurement locations are measured, and the average value of the thicknesses is taken as the "thickness of the second region 22".

The coverage is measured by the following method. The percentage of the length of the outer circumference contacting the second region 22 to the length of the outer circumference is calculated for each first particle 11. The percentages of the first particles 11 are averaged and taken as the "coverage".

Composition analysis of the second region 22 was performed by STEM-EDS for the bonded bodies according to the specific examples. As a result, the Ti concentration in the second region 22 was not less than 50 wt % for each of the specific examples. Ti, N, and O were detected at each of the measurement points. Also, when observing the TEM image, it was confirmed that the second region 22 was a cluster of microcrystals. Carbon was detected in the microcrystals.

The powder body 10 is confirmed in the bonding layer 3 when using brazing materials including carbon. In other words, the first particle 11 that includes carbon and the second region 22 that includes titanium exist in the bonding layer 3. Also, the first particle 11 is surrounded with the second region 22. It is considered that by providing the powder body 10 having such a structure, the strength of the bonded body is increased, and the occurrence of cracks is suppressed.

Cross sections of the bonded bodies according to the specific examples were observed by SEM. The lengths Le1 and Le2 of the first particle 11 were measured in the cross section of each bonded body. Also, the ratio (Le1/Le2) of the length Le1 to the length Le2 was calculated. The method for measuring the lengths Le1 and Le2 and the calculation method of the ratio of the length Le1 to the length Le2 are as described above. The results are shown in Table 7.

TABLE 7

| | Example 1 | Example 2 | Example 3 | Example 4 | Example 5 | Example 6 | Example 7 | Example 8 | Example 9 | Example 10 | Example 11 | Example 12 |
|---|---|---|---|---|---|---|---|---|---|---|---|---|
| Le1/Le2 | 2.1 | 5.6 | 9.5 | 8.1 | 8.0 | 6.8 | 8.5 | 10.7 | 7.8 | 18.7 | 22.3 | 10.5 |

It was confirmed from Table 7 that the ratio of the length Le1 to the length Le2 of the first particle 11 is within the range not less than 1.2 and not more than 40 for the bonded bodies according to the specific examples.

According to the embodiments described above, a bonded body can be provided in which the bonding strength can be increased.

In this specification, "perpendicular" and "parallel" include not only strictly perpendicular and strictly parallel but also, for example, the fluctuation of manufacturing processes, etc.; and it is sufficient to be substantially perpendicular and substantially parallel.

Hereinabove, exemplary embodiments of the invention are described with reference to specific examples. However, embodiments of the invention are not limited to these specific examples. For example, one skilled in the art may similarly practice the invention by appropriately selecting specific configurations of components included in the bonded body such as the substrate, the metal member, the bonding layer, etc., from known art; and such practice is within the scope of the invention to the extent that similar effects can be obtained.

Furthermore, any two or more components of the specific examples may be combined within the extent of technical feasibility, and are within the scope of the invention to the extent that the purport of the invention is included.

Moreover, all bonded bodies practicable by an appropriate design modification by one skilled in the art based on the bonded bodies described above as exemplary embodiments of the invention also are within the scope of the invention to the extent that the purport of the invention is included.

Various modifications and alterations within the spirit of the invention will be readily apparent to those skilled in the art; and all such modifications and alterations should be seen as being within the scope of the invention.

While certain embodiments of the inventions have been described, these embodiments have been presented by way of example only, and are not intended to limit the scope of the inventions. These novel embodiments may be implemented in other various forms; and various omissions, substitutions, and modifications may be made without departing from the spirit of the inventions. Such embodiments and their modifications are within the scope and spirit of the inventions, and are within the scope of the inventions described in the claims and their equivalents.

What is claimed is:

1. A bonded body, comprising:
a substrate;
a metal member; and
a bonding layer provided between the substrate and the metal member,
the bonding layer including
a first particle including carbon,
a first region including a metal, and
a second region provided between the first particle and the first region, the second region including titanium, a concentration of titanium in the second region being greater than a concentration of titanium in the first region.

2. The bonded body according to claim 1, wherein the concentration of titanium in the second region is greater than a concentration of titanium in the first particle.

3. The bonded body according to claim 1, wherein a content ratio of titanium in the second region is not less than 50 mass %.

4. The bonded body according to claim 1, wherein the second region is disposed around the first particle, the second region includes a plurality of second particles, and
at least one of the plurality of second particles includes titanium.

5. The bonded body according to claim 4, wherein a size of one of the plurality of second particles is less than a size of the first particle.

6. The bonded body according to claim 4, wherein the at least one of the plurality of second particles includes titanium and nitrogen.

7. The bonded body according to claim 4, wherein the at least one of the plurality of second particles includes a crystal including titanium and at least one selected from the group consisting of nitrogen and oxygen.

8. The bonded body according to claim 1, wherein a thickness of the second region is not less than 2 nm and not more than 1 μm.

9. The bonded body according to claim 1, wherein a plurality of powder bodies including the first particle and the second region are provided, and
at least two powder bodies of the plurality of powder bodies are separated from each other.

10. The bonded body according to claim 1, wherein the first particle includes a first crystal layer, and the first crystal layer includes carbon.

11. The bonded body according to claim 10, wherein the first crystal layer is disposed along a first direction, and
a length of the first particle in the first direction is greater than a length of the first particle in a second direction crossing the first direction.

12. The bonded body according to claim 11, wherein the length of the first particle in the first direction is not less than 1.2 times and not more than 40 times the length of the first particle in the second direction.

13. The bonded body according to claim 1, wherein the first region includes:
a first partial region including silver; and
a second partial region including copper.

14. The bonded body according to claim 13, wherein the second region contacts the first partial region.

15. The bonded body according to claim 1, wherein a third region includes the metal and is disposed in the first particle.

16. The bonded body according to claim 1, wherein the first particle includes:

a first layer including carbon; and
a second layer including carbon, and
a third region includes the metal and is disposed between the first layer and the second layer.

17. The bonded body according to claim 16, wherein the third region includes at least one element that is a same type as an element included in the substrate.

18. The bonded body according to claim 1, wherein
the bonding layer further includes a fourth region,
the fourth region includes titanium and nitrogen, and
the fourth region is positioned between the substrate and the first region.

19. The bonded body according to claim 1, wherein
the substrate includes silicon and nitrogen, and
the metal member includes copper.

20. A circuit board, comprising:
the bonded body according to claim 1.

21. A semiconductor device, comprising:
the circuit board according to claim 20; and
a semiconductor element mounted on the circuit board.

* * * * *